United States Patent
Ban et al.

(10) Patent No.: US 11,342,043 B2
(45) Date of Patent: May 24, 2022

(54) ELECTRONIC DEVICE FOR CHANGING SHORT-TYPE DEFECTIVE MEMORY CELL TO OPEN-TYPE DEFECTIVE MEMORY CELL BY APPLYING STRESS PULSE

(71) Applicant: SK hynix Inc., Icheon (KR)

(72) Inventors: Sang-Hyun Ban, Hwaseong (KR); Tae-Hoon Kim, Seongnam (KR); Woo-Tae Lee, Seoul (KR); Hye-Jung Choi, Icheon (KR)

(73) Assignee: SK hynix Inc., Icheon (KR)

( * ) Notice: Subject to any disclaimer, the term of this patent is extended or adjusted under 35 U.S.C. 154(b) by 87 days.

(21) Appl. No.: 16/860,566

(22) Filed: Apr. 28, 2020

(65) Prior Publication Data

US 2020/0258592 A1 Aug. 13, 2020

Related U.S. Application Data

(62) Division of application No. 15/854,587, filed on Dec. 26, 2017, now Pat. No. 10,685,733.

(60) Provisional application No. 62/439,430, filed on Dec. 27, 2016.

(51) Int. Cl.
| | |
|---|---|
| *G11C 29/00* | (2006.01) |
| *G11C 29/50* | (2006.01) |
| *G06F 1/24* | (2006.01) |
| *G11C 29/46* | (2006.01) |
| *G11C 29/12* | (2006.01) |

(52) U.S. Cl.
CPC .......... *G11C 29/50004* (2013.01); *G06F 1/24* (2013.01); *G11C 29/12005* (2013.01); *G11C 29/46* (2013.01); *G11C 29/50008* (2013.01); *G11C 29/883* (2013.01); *G11C 2029/5004* (2013.01)

(58) Field of Classification Search
CPC ... G11C 29/04; G11C 29/12005; G11C 29/46; G11C 2029/5004; G11C 29/50004; G11C 29/56008; G06F 1/24
See application file for complete search history.

(56) References Cited

U.S. PATENT DOCUMENTS

| | | | | |
|---|---|---|---|---|
| 4,862,459 A | * | 8/1989 | Fukushima | ...... G11C 29/50012 714/721 |
| 6,452,844 B2 | * | 9/2002 | Koshikawa | ............ G11C 29/72 365/200 |
| 6,597,607 B2 | * | 7/2003 | Koshita | ................ G11C 29/816 365/200 |

(Continued)

FOREIGN PATENT DOCUMENTS

KR 20070043193 A 4/2007

*Primary Examiner* — Esaw T Abraham

(57) ABSTRACT

Provided is an electronic device including a semiconductor memory. The semiconductor memory may include: a plurality of first lines; a plurality of second lines; a plurality of memory cells disposed in respective intersection regions between the plurality of first lines and the plurality of second lines; a first test circuit configured to apply a stress pulse to a first selection line coupled to a defective memory cell among the plurality of memory cells during a first test period, in response to a first test control signal, the first selection line including any one of the plurality of first lines; and a control unit configured to generate the first test control signal based on a first test mode signal.

9 Claims, 6 Drawing Sheets

(56) References Cited

U.S. PATENT DOCUMENTS

| | | | |
|---|---|---|---|
| 6,687,157 B1* | 2/2004 | Liu | G11C 29/36 |
| | | | 365/185.02 |
| 7,177,183 B2* | 2/2007 | Scheuerlein | G11C 8/10 |
| | | | 365/185.02 |
| 7,385,850 B2* | 6/2008 | Jeong | G11C 16/3454 |
| | | | 365/185.09 |
| 8,369,166 B2* | 2/2013 | Kurjanowicz | G11C 29/82 |
| | | | 365/200 |
| 10,871,518 B2* | 12/2020 | Goel | G11C 29/14 |
| 2003/0174566 A1* | 9/2003 | Furutani | G11C 29/02 |
| | | | 365/201 |
| 2005/0088887 A1* | 4/2005 | Wang | G11C 29/848 |
| | | | 365/201 |
| 2006/0256633 A1* | 11/2006 | Louie | G11C 29/832 |
| | | | 365/201 |

* cited by examiner

ELECTRONIC DEVICE FOR CHANGING SHORT-TYPE DEFECTIVE MEMORY CELL TO OPEN-TYPE DEFECTIVE MEMORY CELL BY APPLYING STRESS PULSE

CROSS-REFERENCE TO RELATED APPLICATIONS

The present application is a Divisional Application of U.S. patent application Ser. No. 15/854,587 filed Dec. 26, 2017 and now issued as U.S. Pat. No. 10,685,733, which claims priority to U.S. Provisional Patent Application No. 62/439,430 filed on Dec. 27, 2016, which is incorporated herein by reference in its entirety.

TECHNICAL FIELD

This patent document relates to memory circuits, memory devices, and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems, as well as various implementations of an electronic device that changes one or more short-type defective memory cells, among a plurality of memory cells coupled in a cross-point array architecture, to one or more open-type defective memory cells.

In an implementation, there is provided an electronic device including a semiconductor memory. The semiconductor memory may include: a plurality of first lines; a plurality of second lines; a plurality of memory cells disposed in respective intersection regions between the plurality of first lines and the plurality of second lines; a first test circuit configured to apply a stress pulse to a first selection line coupled to a defective memory cell among the plurality of memory cells during a first test period, in response to a first test control signal, the first selection line including any one of the plurality of first lines; and a control unit configured to generate the first test control signal based on a first test mode signal.

Implementations of the above electronic device may include one or more the following.

The stress pulse may be applied one or more times during the first test period. The stress pulse may correspond to a reset pulse, and wherein the reset pulse may be used to change a resistance state of a write target cell among the plurality of memory cells to a high resistance state during a normal write period. The stress pulse may have a higher amplitude than a reset pulse, a longer pulse width than the reset pulse, or both, and wherein the reset pulse may be used to change a resistance state of a write target cell among the plurality of memory cells to a high resistance state during a normal write period. The semiconductor memory may further include a sensing unit configured to generate a sensing signal by sensing a cell current transferred through a second selection line coupled to the defective memory cell among the plurality of second lines during the first test period, in response to a third test control signal, and the control unit may generate the third test control signal during the first test period. The control unit may additionally enable the first test control signal based on the sensing signal generated by the sensing unit, during the first test period. The stress pulse may be a first stress pulse, wherein the first test circuit additionally applies a second stress pulse to the first selection line during the first test period, in response to the additionally enabled first test control signal, the second stress pulse having the same amplitude and pulse width as the first stress pulse or having a higher amplitude than the first stress pulse, a longer pulse width than the first stress pulse, or both. The semiconductor memory may further include a second test circuit configured to sequentially apply a test read voltage to the plurality of first lines during a second test period, in response to a second test mode signal, and the control unit may generate the second test control signal based on the second test mode signal. The test read voltage may be lower than a threshold voltage when a memory cell is in a high resistance state. The sensing unit may sense a plurality of cell currents which are sequentially transferred through the plurality of second lines during the second test period, in response to the third test control signal, and the control unit may generate the third test control signal during the second test period.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory may be part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory may be part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory may be part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory may be part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory may be part of the memory or the buffer memory in the memory system.

In an implementation, there is provided a method for driving an electronic device including a semiconductor memory. The method may include: determining whether a short-type defective memory cell is present in a plurality of memory cells during a first test period, the plurality of memory cells being disposed in respective intersection regions between a plurality of first lines and a plurality of second lines; and changing the short-type defective memory cell to an open-type defective memory cell during a second test period when the short-type defective memory cell is determined to be present.

Implementations of the above method may include one or more of the following.

Changing the short-type defective memory cell to the open-type defective memory cell may include applying a stress pulse to a first selection line, which is coupled to the short-type defective memory cell, among the plurality of first lines. The stress pulse may be applied one or more times during the first test period. The stress pulse may correspond to a reset pulse, and the reset pulse may change a resistance state of a write target cell among the plurality of memory cells to a high resistance state during a normal write period. The stress pulse may have a higher amplitude than a reset pulse, a longer pulse width than the reset pulse, or both, and the reset pulse may change a resistance state of a write target cell among the plurality of memory cells to a high resistance state during a normal write period. Changing the short-type defective memory cell to the open-type defective memory cell may include: applying a first stress pulse to a first selection line coupled to the short-type defective memory cell, the first selection line being among the plurality of first lines; sensing a cell current transferred through a second selection line coupled to the short-type defective memory cell, the second selection line being among the plurality of second lines; and determining whether to apply a second stress pulse to the first selection line, based on a result of sensing the cell current. Changing the short-type defective memory cell to the open-type defective memory cell may further include applying the second stress pulse to the first selection line, and the second stress pulse may be equal to or different from the first stress pulse. The second stress pulse may have a higher amplitude than the first stress pulse, a longer pulse width than the first stress pulse, or both. Checking whether the short-type defective memory cell is present may include: writing data corresponding to a high resistance state to the respective memory cells; and reading data from the respective memory cells based on a test read voltage. The test read voltage may be lower than a threshold voltage when a memory cell is in a high resistance state.

DETAILED DESCRIPTION

Various examples and implementations of the disclosed technology are described below in detail with reference to the accompanying drawings.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single-layer or multi-layer structure, which exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO), or a cobalt oxide (CoO), or a perovskite material such as a strontium titanium oxide (STO: SrTiO) or a praseodymium calcium manganese oxide (PCMO: PrCaMnO).

Moreover, the variable resistance element may include a phase change material. The phase change material may include a chalcogenide material such as germanium-antimony-tellurium (GST: GeSbTe). The variable resistance element switches between different resistance states by changing its structure into a crystalline state or an amorphous state using a heat.

The variable resistance element may include two magnetic layers and a tunnel barrier layer interposed between the two magnetic layers. The magnetic layer may include nickel-ferrum-cobalt (NiFeCo) or Cobalt-ferrum (CoFe), etc. The tunnel barrier layer may include aluminum oxide ($Al_2O_3$). The variable resistance element may switch between two different resistance states according to magnetization directions of the two magnetic layers. For example, the variable resistance element may be in a low resistance state when the magnetization directions of the two magnetic layers are parallel, and be in a high resistance state when the magnetization directions of the two magnetic layers are anti-parallel.

Figure 1:
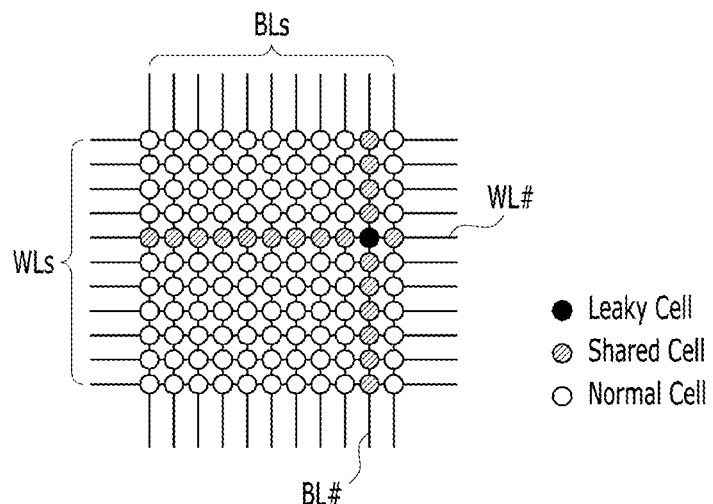
FIG. 1 illustrates a memory cell array for describing problems of the related art.

FIG. 1 illustrates a memory cell array for describing problems of the related art.

Referring to FIG. 1, the memory cell array may include a plurality of memory cells coupled in a cross-point array architecture. That is, the plurality of memory cells may be disposed in respective intersection regions between a plurality of bit lines BLs and a plurality of word lines WLs, and may be coupled between the plurality of bit lines BLs and the plurality of word lines WLs. Among the plurality of memory cells, memory cells arranged in the same column line may share the same bit line, and memory cells arranged in the same row line may share the same word line.

The plurality of memory cells may include a short-type defective memory cell, which is caused by a process issue, an electrical damage, or the like. The short-type defective memory cell may include any of a memory cell having a defect, such that a current flowing through the memory cell unexpectedly leaks to a sink path, for example, to a ground voltage terminal, and a memory cell having a lower threshold voltage than a normal memory cell. Hereafter, the short-type defective memory cell will be referred to as a "leaky cell."

When a leaky cell occurs, normal data may not be written to or read from memory cells that share a bit line BL # or a word line WL # with the leaky cell. Hereafter, the bit line BL # to which the leaky cell is coupled will be referred to as a "shared bit line BL #," the word line WL # to which the leaky cell is coupled will be referred to as a "shared word line WL #," and a memory cell coupled to the shared bit line BL # or the shared word line WL # will be referred to as a "shared cell." For example, during a write operation, a level of a write voltage applied to the shared cell may be dropped by a current leakage generated through the leaky cell, and thus normal data may not be written to the shared cell due to the level drop of the write voltage. Furthermore, during a read operation, data corresponding to a low resistance state will be read from the shared cell, regardless of the real data stored in the shared cell, due to the current leakage through the leaky cell. For example, data corresponding to the low resistance state may be mistakenly read from the shared cell, even if the shared cell is storing data corresponding to a high resistance state.

Therefore, during a repair operation, the shared cells as well as the leaky cell are ordinarily replaced with repair memory cells. That is, memory cells arranged in the same column as the leaky cell and memory cells arranged in the same row as the leaky cell are all ordinarily repaired. If all of the shared cells are normal memory cells and the memory cell array includes '2 k×1 k' memory cells, '2 k+1 k−1', the normal memory cells are ordinarily repaired even if there is only one leaky cell. Hereafter, the normal memory cells will be referred to as "normal cells."

In contrast, the present implementation provides a technique capable of addressing a leaky cell by repairing the leaky cell without necessarily repairing normal cells sharing a bit line or word line with the leaky cell.

Figure 2:
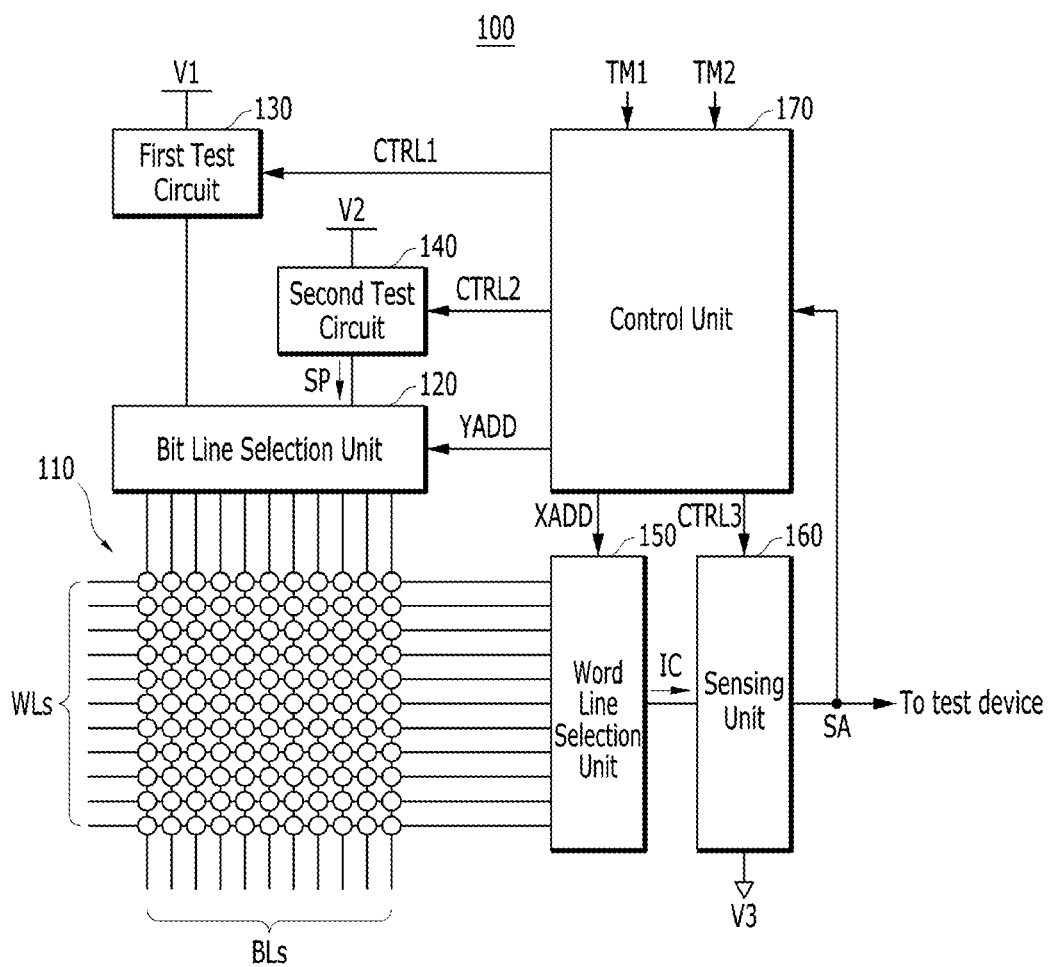
FIG. 2 is a configuration diagram of a memory device in accordance with an implementation.

FIG. 2 illustrates a memory device 100 in accordance with an implementation.

Referring to FIG. 2, the memory device 100 may include a memory cell array 110, a bit line selection unit 120, a first test circuit 130, a second test circuit 140, a word line selection unit 150, a sensing unit 160, and a control unit 170.

The memory cell array 110 may include a plurality of memory cells coupled in a cross-point array architecture. That is, the plurality of memory cells may be disposed in the respective intersection regions between a plurality of bit lines BLs and a plurality of word lines WLs, and coupled between the plurality of bit lines BLs and the plurality of word lines WLs. Among the plurality of memory cells, memory cells arranged in the same column line may share the same bit line, and memory cells arranged in the same row line may share the same word line.

Each of the memory cells may include a variable resistance element and a selecting element. The variable resistance element may have a high resistance state or a low resistance state depending on a logical value of data written in the variable resistance element. The high resistance state may also be referred to as a 'RESET' state. The low resistance state may also be referred to as a 'SET' state. The variable resistance element may, for example, include a phase change material. The selecting element may be turned on by a voltage difference between both terminals thereof. For example, the selecting element may include any of a diode, a Schottky diode, an OTS (Ovonic Threshold Switch), a MIT (Metal Insulator Transistor), and a MIET (Mixed Ion-Electron Conducting) device. A leaky cell may occur due to one or more defects generated in the variable resistance element and/or the selecting element. For example, the one or more defects may be generated by a process variation or a process damage generated during a semiconductor manufacturing process such as a CMP (Chemical-Mechanical Planarization) process or another etch process.

The bit line selection unit 120 may couple a selected bit line of the plurality of bit lines BLs to the first or second test circuit 130 or 140 based on a bit line select signal YADD. For example, the bit line selection unit 120 may sequentially couple each of the plurality of bit lines BLs to the first test circuit 130 during a first test period. Furthermore, the bit line selection unit 120 may couple a shared bit line of the plurality of bit lines BLs to the second test circuit 140 during a second test period.

The first test circuit 130 may supply a test read voltage V1 to the bit line selection unit 120 during the first test period, in response to a first test control signal CTRL1. The test read voltage V1 may have a lower voltage level than a threshold voltage when a memory cell is in a low resistance state. However, the test read voltage V1 may not be limited thereto. The test read voltage V1 may have a lower level than a threshold voltage when the memory cell is in a high resistance state, a voltage level of the test read voltage V1 being determined by considering a sensing margin between a leaky cell and a normal cell. The first test circuit 130 may include a read circuit which is activated during a normal read operation.

The second test circuit 140 may apply a stress pulse SP to the bit line selection unit 120 during the second test period, in response to a second test control signal CTRL2. The second test circuit 140 may change a leaky cell to an open-type defective memory cell by applying the stress pulse SP to the leaky cell. For example, when a void is formed in the leaky cell by the stress pulse SP or when one or more properties of a variable resistance element and a selecting element included in the leaky cell are changed by the stress pulse SP, the leaky cell may be changed to the open-type defective memory cell.

The open-type defective memory cell may be a memory cell having a floating state. In the floating state, no current flows through the memory cell, or the memory cell has a very high resistance state corresponding to the floating state, so that current is significantly prevented from flowing through the memory cell. Thus, no current or significantly low current flows through the open-type defective memory cell. Hereafter, the open-type defective memory cell will be referred to as an "open cell."

The second test circuit 140 may apply the stress pulse SP to the bit line selection unit 120 after supplying a test write voltage V2 to the bit line selection unit 120 in a similar manner to a normal write operation. For example, the second test circuit 140 may include a write circuit, which is activated during the normal write operation.

The stress pulse SP may be generated one or more times during the second test period. For example, the stress pulse SP may correspond to a current-type reset pulse. The reset pulse may be used for changing a resistance state of a write target cell among the plurality of memory cells to the high resistance state (or the RESET state) during a normal write period. However, the stress pulse SP may not be limited to the reset pulse, but may have a larger magnitude than the reset pulse. For example, the stress pulse SP may have a higher amplitude than the reset pulse, a longer pulse width than the reset pulse, or both.

The second test circuit 140 may apply a second stress pulse SP to the bit line selection unit 120 during the second test period, in response to the second test control signal CTRL2. The previously applied stress pulse SP may be referred to as a first stress pulse SP. That is, the second test circuit 140 may apply the second stress pulse SP to the leaky cell. In an implementation, the second stress pulse SP has the same characteristics as the first stress pulse SP. For example, the second stress pulse SP has the same amplitude and pulse width as the first stress pulse SP. In another implementation, the second stress pulse SP has different characteristics from the first stress pulse SP. For example, the second stress pulse SP has a higher amplitude than the first stress pulse SP, a longer pulse width than the first stress pulse SP, or both.

The word line selection unit 150 may couple a selected word line of the plurality of word lines WLs to the sensing unit 160 based on a word line select signal XADD. For example, the word line selection unit 150 may sequentially couple the plurality of word lines WLs to the sensing unit 160 during the first test period. The word line selection unit 150 may couple a shared word line of the plurality of word lines WLs to the sensing unit 160 during the second test period.

The sensing unit 160 may sense a cell current IC transferred through the word line selection unit 150 in response to a third test control signal CTRL3. For example, the sensing unit 160 may sense cell currents IC which are sequentially transferred through the word line selection unit 150 during the first test period, and may provide sensing signals SA corresponding to the sensing results to a test device (not illustrated). The sensing signals SA generated during the first test period may contain information for determining whether a leaky cell is present among the plurality of memory cells. For example, when the sensing unit 160 senses that an arbitrary cell current IC corresponds to a "normal current" generated from a normal cell, the sensing unit 160 may generate a sensing signal SA containing information corresponding to the normal current. On the other hand, when the sensing unit 160 senses that an arbitrary cell current IC corresponds to a "leaky current" generated from a leaky cell, the sensing unit 160 may generate a sensing signal SA containing information corresponding to the leaky current.

Furthermore, the sensing unit 160 may sense a cell current IC transferred through the word line selection unit 150 during the second test period, and provide a sensing signal SA corresponding to the sensing result to the control unit 170. The sensing signal SA generated during the second test period may contain information for determining whether to change the leaky cell to an open cell. For example, when the sensing unit 160 senses a cell current IC, corresponding to the stress pulse SP, as a "stress current," corresponding to the leaky cell, the sensing unit 160 may generate a sensing signal SA containing information corresponding to the stress current. On the other hand, when the sensing unit 160 senses the cell current IC, corresponding to the stress pulse SP, as a "void current," corresponding to the open cell, the sensing unit 160 may generate a sensing signal SA containing information corresponding to the void current. When the sensing signal SA contains the information corresponding to the stress current, the leaky cell is determined to be changed to the open cell. On the other hand, when the sensing signal SA contains the information corresponding to the void current, it is determined that the leaky cell has been changed to the open cell.

The control unit 170 may generate the first to third test control signals CTRL1 to CTRL3, the bit line select signal YADD, and the word line select signal XADD based on first and second test mode signals TM1 and TM2 and a sensing signal SA. For example, based on the first test mode signal TM1, the control unit 170 may continuously enable the first test control signal CTRL1, periodically enable the third test control signal CTRL3 in response to cell currents IC which are sequentially generated from the plurality of memory cells, sequentially generate bit line select signals YADD for selecting the plurality of bit lines BLs according to a preset order, and sequentially generate word line select signals XADD for selecting the plurality of word lines WLs according to a preset order, during the first test period. Furthermore, based on the second test mode signal TM2, the control unit 170 may enable the second and third test control signals CTRL2 and CTRL3 a number of times that corresponds to the number of leaky cells, and may generate bit line select signals YADD and word line select signals XADD a number of times that corresponds to the number of leaky cells, during the second test period. The control unit 170 may enable the second and third test control signals CTRL2 and CTRL3 based on a sensing signal SA, during the second test period.

Hereafter, an operation of the memory device 100 having the above-described configuration shown in FIG. 2 will be described with reference to FIGS. 3 to 5.

Figure 3:
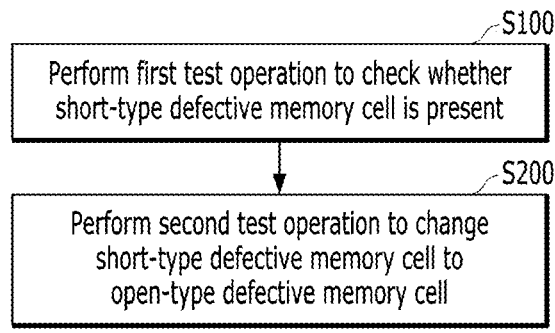
FIGS. 3 to 5 are flow charts for describing operations of the memory device illustrated in FIG. 2 in accordance with various implementations.

FIG. 3 is a flowchart for describing the operation of the memory device 100 of FIG. 2 in accordance with an implementation.

Referring to FIG. 3, the memory device 100 may perform a first test operation under the control of a test device at step S100, and then perform a second test operation at step S200. The first test operation may include a process of checking whether a short-type defective memory cell, i.e., a leaky cell, is present in the plurality of memory cells, during the first test period. The second test operation may include a process of changing the leaky cell to an open-type defective memory cell, i.e., an open cell, during the second test period.

Figure 4:
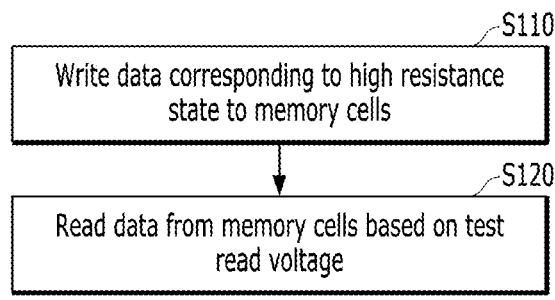

FIG. 4 is a flowchart for describing the first test operation of FIG. 3 in more detail.

Referring to FIG. 4, the memory device 100 may write data corresponding to a high resistance state to the plurality of memory cells at step S110.

In some implementations, the write step S110 may not be necessarily performed. For example, when each of the memory cells has a resistance value corresponding to a low resistance state, the write step S110 is not performed.

In other implementations, in order to secure a sensing margin between a leaky cell and a normal cell, the write step S110 is performed. The write step S110 may be performed as follows.

The second test circuit 140 may perform the operation of writing the data corresponding to the high resistance state to the plurality of memory cells. The following descriptions will be based on the pre-supposition that the second test circuit 140 performs the operation of writing the data corresponding to the high resistance state to the plurality of memory cells. When any one of the plurality of memory cells is selected by the bit line selection unit 120 and the word line selection unit 150, the second test circuit 140 may supply a test write voltage V2 to a first end of the selected memory cell, and the sensing unit 160 may supply a test sink voltage V3 to a second end of the selected memory cell. A voltage difference between the first and second ends of the selected memory cell may be a voltage (V2−V3) obtained by subtracting the test sink voltage V3 from the test write voltage V2. The voltage difference (V2−V3) may have a higher level than a threshold voltage of the selected memory cell. When the selected memory cell is turned on by the voltage difference (V2−V3), the second test circuit 140 may apply a stress pulse SP as a reset pulse to the selected memory cell. The selected memory cell may be changed to a high resistance state by the reset pulse. The above-described processes may be sequentially performed on the other memory cells of the plurality of memory cells.

When the data corresponding to the high resistance state are written to all of the plurality of memory cells, the memory device 100 may read the written data from the respective memory cells based on the test read voltage V1, at step S120. More specifically, when any one of the plurality of memory cells is selected by the bit line selection unit 120 and the word line selection unit 150, the first test circuit 130 may supply the test read voltage V1 to a first end of the selected memory cell, and the sensing unit 160 may supply the test sink voltage V3 to a second end of the selected memory cell. A voltage difference between the first and second ends of the selected memory cell may be a voltage (V1−V3) obtained by subtracting the test sink voltage V3 from the test read voltage V1. At this time, the voltage difference (V1−V3) may have a lower level than a threshold voltage when the selected memory cell is in the low resistance state or the high resistance state. That is, the selected memory cell may not be turned on by the voltage difference (V1−V3). Therefore, when the selected memory cell is a normal cell, a cell current IC flowing through the selected memory cell may have a low level corresponding to the high resistance state, and thus the cell current IC may be a normal current. On the other hand, when the selected memory cell is a leaky cell and thus there is a current leakage through the selected memory cell, the cell current IC flowing through the selected memory cell may have a high level corresponding to the low resistance state, and thus the cell current IC may be a leaky current. The sensing unit 160 may generate a sensing signal SA containing information on whether the selected memory cell is the normal cell or the leaky cell, based on the cell current IC. The above-described processes may be sequentially performed on the other memory cells of the plurality of memory cells.

Figure 5:
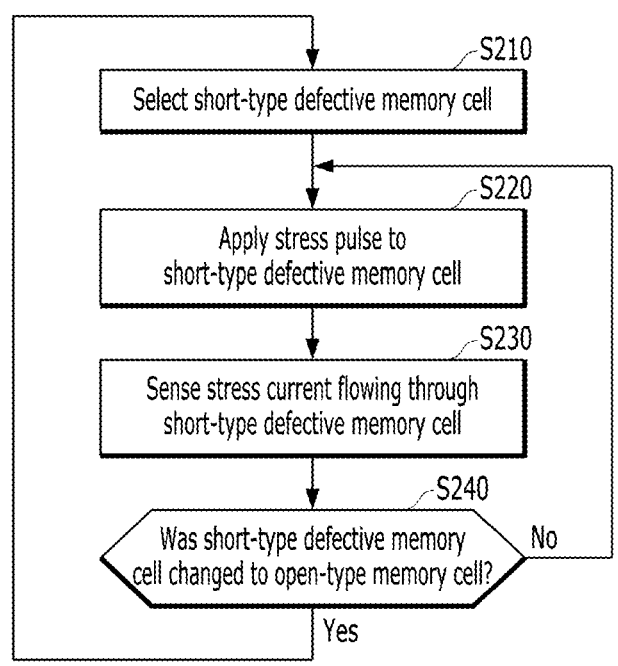

FIG. 5 is a flowchart for describing the second test operation of FIG. 3 in more detail.

Referring to FIG. 5, at step S210, the memory device 100 may select a leaky cell determined through the first test operation. For example, the bit line selection unit 120 may select a shared bit line among the plurality of bit lines BLs based on the bit line select signal YADD, and the word line selection unit 150 may select a shared word line among the plurality of word lines WLs based on the word line select signal XADD.

The memory device 100 may apply the stress pulse SP to the leaky cell at step S220. For example, when the leaky cell is selected by the bit line selection unit 120 and the word line selection unit 150, the test write voltage V2 may be supplied to a first end of the leaky cell by the second test circuit 140, and the test sink voltage V3 may be supplied to a second end of the selected memory cell by the sensing unit 160. A voltage difference between the first and second ends of the selected memory cell may correspond to a voltage (V2−V3) obtained by subtracting the test sink voltage V3 from the test write voltage V2. The voltage difference (V2−V3) may have a higher level than a threshold voltage of the leaky cell. When the leaky cell is turned on by the voltage difference (V2−V3), the second test circuit 140 may apply the stress pulse SP to the leaky cell based on the second test control signal CTRL2. For example, the second test circuit 140 may generate the stress pulse SP to have one or more pulses when the second test control signal CTRL2 is enabled once. At this time, the stress pulse SP may have the same amplitude and pulse width as the reset pulse. However, implementations are not limited thereto. In other implementations, in order to improve the test efficiency, the stress pulse SP may have a higher amplitude than the reset pulse, a longer pulse width than the reset pulse, or both. Since the stress pulse SP applies electrical stress to the leaky cell, the leaky cell may be changed to an open cell.

The memory device 100 may sense the cell current IC flowing through the leaky cell at step S230. Depending on the sensing result, it is determined whether the leaky cell, i.e., the short-type defective memory cell, is changed to the open cell, i.e., the open-type defective memory cell, at step S240. That is, depending on the sensing result, the memory device 100, e.g., the control unit 170, may decide whether to additionally apply a stress pulse SP, e.g., a second stress pulse SP, to the leaky cell or decide whether to select another leaky cell to perform the above-described processes, at step S240.

For example, when the cell current IC corresponding to the stress pulse SP is sensed as a stress current corresponding to a leaky cell, the sensing unit 160 may generate a sensing signal SA containing information corresponding to the stress current, and the control unit 170 may additionally enable the second test control signal CTRL2 based on the sensing signal SA.

In this case, the second test circuit 140 may apply the second stress pulse SP to the leaky cell. In an implementation, the second stress pulse SP has the same characteristics as the previous stress pulse SP. For example, the second stress pulse SP may have the same amplitude and pulse width as the previous stress pulse SP. Alternatively, the second stress pulse SP has different characteristics than the previous stress pulse SP. For example, the second stress pulse SP may have a higher amplitude than the previous stress pulse SP, e.g., a first stress pulse SP, a longer pulse width than the previous stress pulse SP, or both. That is, electrical stress that is the same as previous electrical stress caused by the first stress pulse, or electrical stress that is larger than the previous electrical stress may be applied to the leaky cell by the second stress pulse SP.

On the other hand, when the cell current IC corresponding to the stress pulse SP is sensed as a void current corresponding to an open cell, the sensing unit 160 may generate a sensing signal SA containing information corresponding to the void current, and the control unit 170 may generate a bit line select signal YADD and a word line select signal XADD corresponding to another leaky cell, based on the sensing signal SA.

In accordance with the above-described semiconductor memory, a leaky cell is changed to an open cell. Since the open cell may have no influence on an operation of a normal cell sharing a bit line or word line with the open cell, the normal cell does not need to be repaired. Therefore, the operation characteristic of the semiconductor memory can be improved.

In accordance with the present implementations, when there are short-type defective memory cells among the plurality of memory cells coupled in the cross-point array architecture, the short-type defective memory cells need to be repaired on a column and row basis. The short-type defective memory cells are changed to open defective memory cells since the open defective memory cells have no influence on operations of normal cells sharing bit lines or word lines with the open defective memory cells. The open-type defective memory cells are repaired without repairing the normal cells sharing the bit lines or word lines with the open-type defective memory cells.

Since only the open-type defective memory cells are repaired, a repair time, a repair cost, and a circuit area required for a repair operation can be minimized.

The above and other memory circuits or semiconductor devices based on the disclosed technology may be used in a range of devices or systems. FIGS. 6-10 provide some examples of devices or systems that may implement memory circuits disclosed herein.

Figure 6:
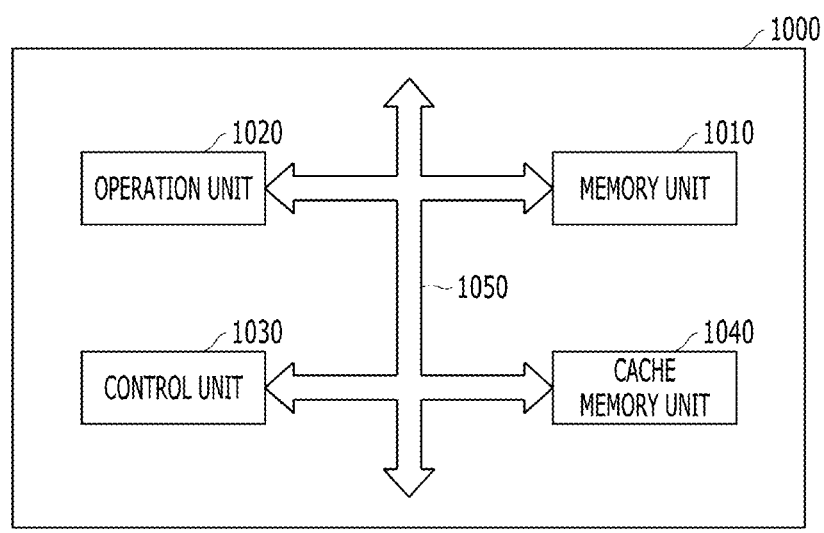
FIG. 6 is an example of a configuration diagram of a microprocessor implementing memory circuitry based on the disclosed technology.

FIG. 6 is an example of a configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be any of various data processing units such as a central processing unit (CPU), a graphic processing unit (GPU), a digital signal processor (DSP), and an application processor (AP).

The memory unit 1010 is a part which stores data in the microprocessor 1000, as a processor register, or the like. The memory unit 1010 may include a data register, an address register, a floating point register, and so on. The memory unit 1010 may additionally include various registers. The memory unit 1010 may perform the function of temporarily storing data for which operations are to be performed by the operation unit 1020, result data of performing the operations, and addresses where data for performing the operations are stored.

The memory unit 1010 may include one or more of the above-described semiconductor devices in accordance with implementations of the present disclosure. For example, the memory unit 1010 may include a semiconductor device according to an implementation of the present disclosure, the semiconductor device including a plurality of first lines; a plurality of second lines; a plurality of memory cells disposed in respective intersection regions between the plurality of first lines and the plurality of second lines; a first test circuit suitable for applying a stress pulse to a first selection line coupled to one or more defective memory cells among the plurality of memory cells during a first test period, based on a first test control signal, the first selection line including any one of the plurality of first lines; and a control unit suitable for generating the first test control signal based on a first test mode signal. Using the semiconductor device according to the implementation, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020, and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
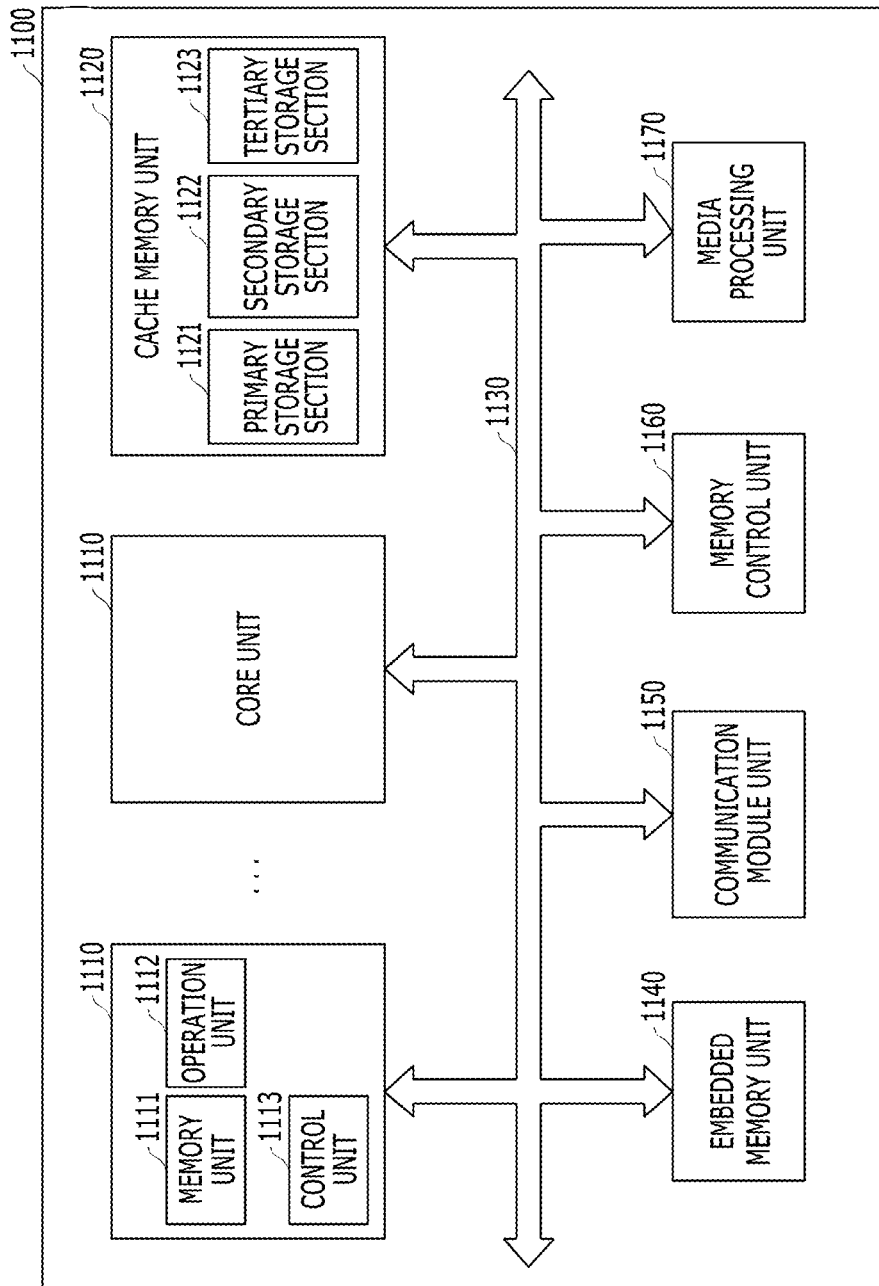
FIG. 7 is an example of a configuration diagram of a processor implementing memory circuitry based on the disclosed technology.

FIG. 7 is an example of a configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 for storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112, and a control unit 1113.

The memory unit 1111 is a part which stores data in the processor 1100, as a processor register, a register or the like. The memory unit 1111 may include a data register, an address register, a floating point register, and so on. The memory unit 1111 may additionally include various registers. The memory unit 1111 may perform the function of temporarily storing data for which operations are to be performed by the operation unit 1112, result data of performing the operations, and addresses where data for performing the operations are stored.

The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112, and an external device of the processor 1100, perform extraction, decoding of commands, and controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be designed according to a desired application of the cache memory unit 1120. The speeds at which the primary, secondary, and tertiary storage sections 1121, 1122, and 1123 store and discriminate data may be the same or different. In the case where the speeds of the respective storage sections 1121, 1122, and 1123 are different, the speed of the primary storage section 1121 may be largest. At least one storage section of the primary storage section 1121, the secondary storage section 1122, and the tertiary storage section 1123 of the cache memory unit 1120 may include one or more of the above-described semiconductor devices in accordance with the implementations. For example, the cache memory unit 1120 may include a semiconductor device according to an implementation of the present disclosure, the semiconductor device including a plurality of first lines; a plurality of second lines; a plurality of memory cells disposed in respective intersection regions between the plurality of first lines and the plurality of second lines; a first test circuit suitable for applying a stress pulse to a first selection line coupled to one or more defective memory cells among the plurality of memory cells during a first test period, based on a first test control signal, the first selection line including any one of the plurality of first lines; and a control unit suitable for generating the first test control signal based on a first test mode signal. Using the semiconductor device according to the implementation, characteristics of the cache memory unit 1120 may be improved. As a consequence, performance characteristics of the processor 1100 may be improved.

Although it is shown in FIG. 7 that all the primary, secondary, and tertiary storage sections 1121, 1122, and 1123 are configured inside the cache memory unit 1120, it is to be noted that all the primary, secondary, and tertiary storage sections 1121, 1122, and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121 and 1122 may be disposed inside the core unit 1110, and the tertiary storage section 1123 may be disposed outside the core unit 1110.

The bus interface 1130 is a part which connects the core unit 1110, the cache memory unit 1120, and an external device, and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core units 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage sections 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. The processor 1100 may additionally include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to the above mentioned memories, and so on. The nonvolatile memory may include any of a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network, or both. The wired network module may include any of a local area network (LAN), a universal serial bus (USB), an Ethernet, power line communication (PLC) such as various devices which send and receive data through transmit lines, and so on. The wireless network module may include any of Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include any of various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
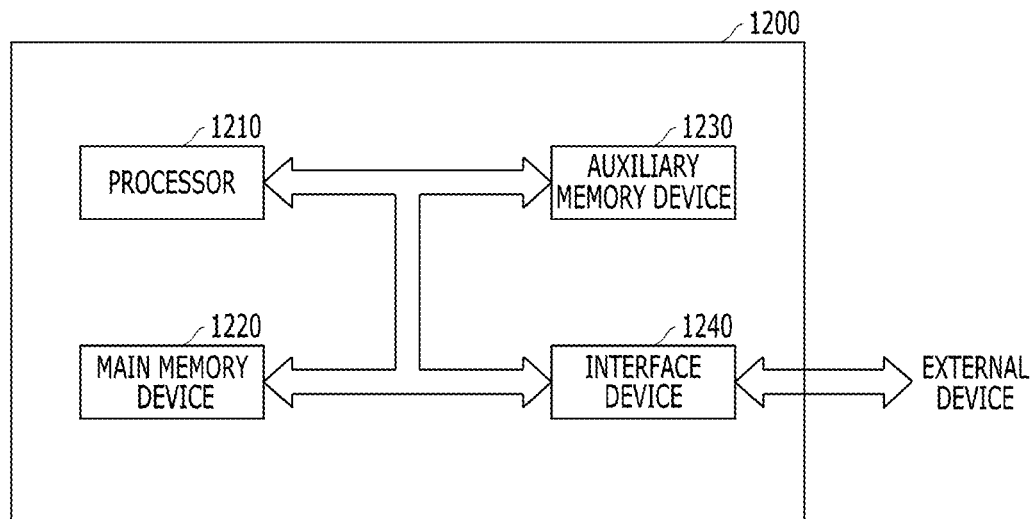
FIG. 8 is an example of a configuration diagram of a system implementing memory circuitry based on the disclosed technology.

FIG. 8 is an example of a configuration diagram of a system implementing memory circuitry based on the disclosed technology.

Referring to FIG. 8, a system 1200 as an apparatus for processing data may perform input, processing, output, communication, storage, etc. to conduct a series of manipulations of data. The system 1200 may include a processor 1210, a main memory device 1220, an auxiliary memory device 1230, an interface device 1240, and so on. The system 1200 of the present implementation may be any of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include any of a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call, and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a semiconductor device according to an implementation of the present disclosure, the semiconductor device including a plurality of first lines; a plurality of second lines; a plurality of memory cells disposed in respective intersection regions between the plurality of first lines and the plurality of second lines; a first test circuit suitable for applying a stress pulse to a first selection line coupled to one or more defective memory cells among the plurality of memory cells during a first test period, based on a first test control signal, the first selection line including any one of the plurality of first lines; and a control unit suitable for generating the first test control signal based on a first test mode signal. Using the semiconductor device according to the implementation, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a semiconductor device according to an implementation of the present disclosure, the semiconductor device including a plurality of first lines; a plurality of second lines; a plurality of memory cells disposed in respective intersection regions between the plurality of first lines and the plurality of second lines; a first test circuit suitable for applying a stress pulse to a first selection line coupled to one or more defective memory cells among the plurality of memory cells during a first test period, based on a first test control signal, the first selection line including any one of the plurality of first lines; and a control unit suitable for generating the first test control signal based on a first test mode signal. Using the semiconductor device according to the implementation, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be configured to perform exchange of commands and data between the system 1200 of the present implementation and an external device. The interface device 1240 may include any of a keypad, a keyboard, a mouse, a speaker, a microphone, a display, various human interface devices (HIDs), a communication device, and so on. The communication device may include a module capable of being connected with a wired network, a module capable of being connected with a wireless network, or both. The wired network module may include any of a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB), such as various devices which send and receive data without transmit lines, and so on.

Figure 9:
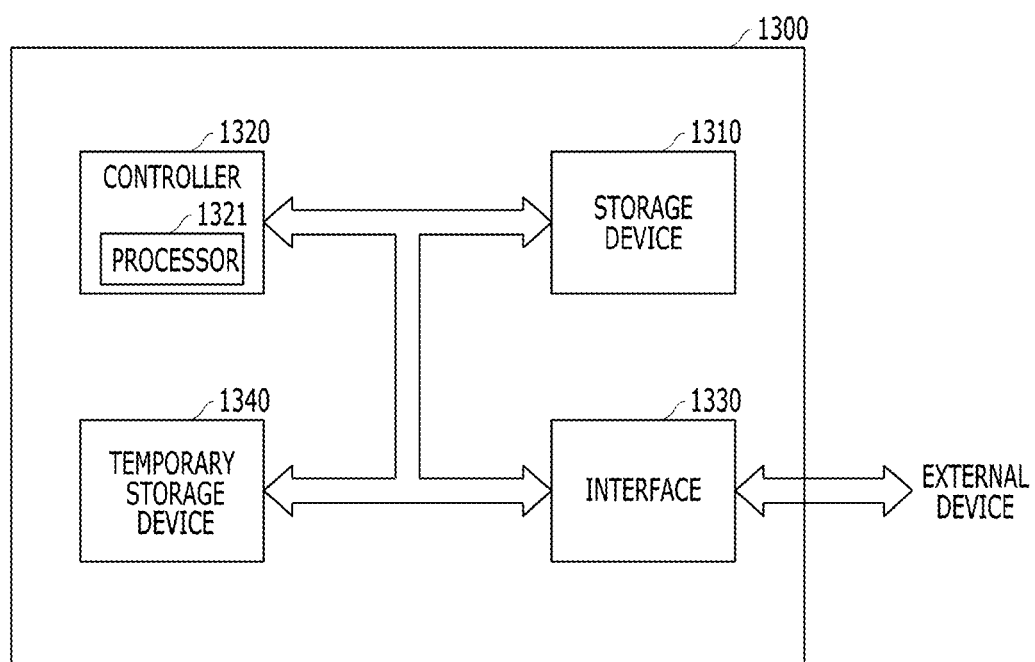
FIG. 9 is an example of a configuration diagram of a data storage system implementing memory circuitry based on the disclosed technology.

FIG. 9 is an example of a configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be any of a disk type such as a hard disk drive (HDD), a compact disc read only memory (CDROM), a digital versatile disc (DVD), a solid state disk (SSD), and so on; and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include any of a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above-mentioned interfaces. The interface 1330 may be compatible with one or more interfaces having different types from each other.

The temporary storage device 1340 can store data temporarily for efficiently transferring data between the interface 1330 and the storage device 1310 according to diversifications and high-performance implementations of an interface with an external device, a controller and a system. The temporary storage device 1340 for temporarily storing data may include one or more of the above-described semiconductor devices in accordance with the implementations. For example, the temporary storage device 1340 may include a semiconductor device according to an implementation of the present disclosure, the semiconductor device including a plurality of first lines; a plurality of second lines; a plurality of memory cells disposed in respective intersection regions between the plurality of first lines and the plurality of second lines; a first test circuit suitable for applying a stress pulse to a first selection line coupled to one or more defective memory cells among the plurality of memory cells during a first test period, based on a first test control signal, the first selection line including any one of the plurality of first lines; and a control unit suitable for generating the first test control signal based on a first test mode signal. Using the semiconductor device according to the implementation, characteristics of the temporary storage device 1340 may be improved. As a consequence, performance characteristics of the system 1300 may be improved.

Figure 10:
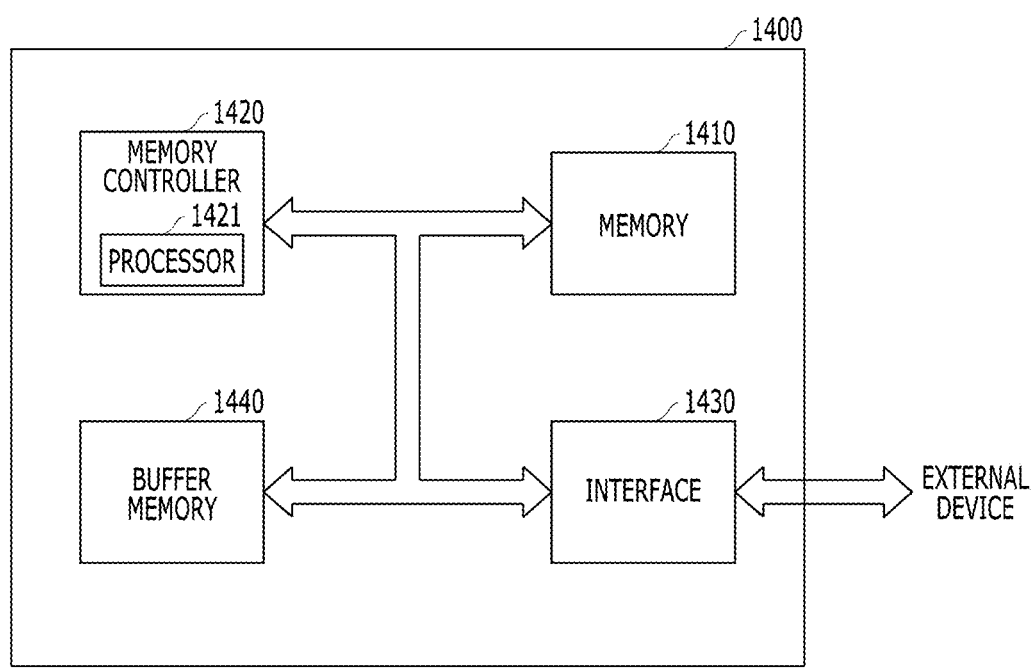
FIG. 10 is an example of a configuration diagram of a memory system implementing memory circuitry based on the disclosed technology.

FIG. 10 is an example of a configuration diagram of a memory system implementing memory circuitry based on the disclosed technology.

Referring to FIG. 10, a memory system 1400 may include a memory 1410 which is a component for storing data having a nonvolatile characteristic, a memory controller 1420 which controls the memory 1410, an interface 1430 for connection with an external device, and so on. The memory system 1400 may be any of a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a semiconductor device according to an implementation of the present disclosure, the semiconductor device including a plurality of first lines; a plurality of second lines; a plurality of memory cells disposed in respective intersection regions between the plurality of first lines and the plurality of second lines; a first test circuit suitable for applying a stress pulse to a first selection line coupled to one or more defective memory cells among the plurality of memory cells during a first test period, based on a first test control signal, the first selection line including any one of the plurality of first lines; and a control unit suitable for generating the first test control signal based on a first test mode signal. Using the semiconductor device according to the implementation, characteristics of the memory 1410 may be improved. As a consequence, performance characteristics of the memory system 1400 may be improved.

Also, the memory 1410 according to the present implementation may further include any of a ROM (read only memory), a NOR flash memory, a NAND flash memory, a phase change random access memory (PRAM), a resistive random access memory (RRAM), a magnetic random access memory (MRAM), and so on, which have nonvolatile characteristics.

The memory controller 1420 may control exchange of data between the memory 1410 and the interface 1430. To this end, the memory controller 1420 may include a processor 1421 for performing an operation for and processing commands inputted through the interface 1430 from a source outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having different types from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a semiconductor device according to an implementation of the present disclosure, the semiconductor device including a plurality of first lines; a plurality of second lines; a plurality of memory cells disposed in respective intersection regions between the plurality of first lines and the plurality of second lines; a first test circuit suitable for applying a stress pulse to a first selection line coupled to one or more defective memory cells among the plurality of memory cells during a first test period, based on a first test control signal, the first selection line including any one of the plurality of first lines; and a control unit suitable for generating the first test control signal based on a first test mode signal. Using the semiconductor device according to the implementation, characteristics of the buffer memory 1440 may be improved. As a consequence, performance characteristics of the memory system 1400 may be improved.

Moreover, the buffer memory 1440 according to the present implementation may further include any of an SRAM (static random access memory), a DRAM (dynamic random access memory), and so on, which have volatile characteristics, and a phase change random access memory (PRAM), a resistive random access memory (RRAM), a spin transfer torque random access memory (STTRAM), a magnetic random access memory (MRAM), and so on, which have nonvolatile characteristics. Unlike this, the buffer memory 1440 may not include the semiconductor devices according to the implementations, but may include any of an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have nonvolatile characteristics.

As is apparent from the above descriptions, in the semiconductor device and the method for fabricating the same in accordance with the disclosed implementations, a resistance variable element may be easily patterned, and the characteristics of the resistance variable element may be secured.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for driving an electronic device including a semiconductor memory, the method comprising:
   determining whether a short-type defective memory cell is present in a plurality of memory cells by sensing a cell current flowing through each of the plurality of memory cells during a first test period, the plurality of memory cells being disposed in respective intersection regions between a plurality of first lines and a plurality of second lines; and
   changing the short-type defective memory cell to an open-type defective memory cell during a second test period when the short-type defective memory cell is determined to be present in the plurality of memory cells,
   wherein changing the short-type defective memory cell to the open-type defective memory cell comprises applying a stress pulse to a first selection line, which is coupled to the short-type defective memory cell, among the plurality of first lines.

2. The method of claim 1, wherein the stress pulse is applied one or more times during the first test period.

3. The method of claim 1, wherein the stress pulse corresponds to a reset pulse, and
   wherein the reset pulse changes a resistance state of a write target cell among the plurality of memory cells to a high resistance state during a normal write period.

4. The method of claim 1, wherein the stress pulse has a higher amplitude than a reset pulse, a longer pulse width than the reset pulse, or both, and
   wherein the reset pulse changes a resistance state of a write target cell among the plurality of memory cells to a high resistance state during a normal write period.

5. The method of claim 1, wherein changing the short-type defective memory cell to the open-type defective memory cell comprises:
   applying a first stress pulse to the first selection line coupled to the short-type defective memory cell;
   sensing a cell current transferred through a second selection line coupled to the short-type defective memory cell, the second selection line being among the plurality of second lines; and
   determining whether to apply a second stress pulse to the first selection line, based on a result of sensing the cell current.

6. The method of claim 5, wherein changing the short-type defective memory cell to the open-type defective memory cell further comprises applying the second stress pulse to the first selection line, and
   wherein the second stress pulse is equal to or different from the first stress pulse.

7. The method of claim 6, wherein the second stress pulse has a higher amplitude than the first stress pulse, a longer pulse width than the first stress pulse, or both.

8. The method of claim 1, wherein checking whether the short-type defective memory cell is present comprises:
   writing data corresponding to a high resistance state to the respective memory cells; and
   reading data from the respective memory cells based on a test read voltage.

9. The method of claim 8, wherein the test read voltage is lower than a threshold voltage when a memory cell is in a high resistance state.

* * * * *